United States Patent
Wu et al.

(10) Patent No.: US 9,793,286 B2
(45) Date of Patent: Oct. 17, 2017

(54) EMBEDDED HKMG NON-VOLATILE MEMORY

(71) Applicant: Taiwan Semiconductor Manufacturing Co., Ltd., Hsin-Chu (TW)

(72) Inventors: Wei Cheng Wu, Zhubei (TW); Tzu-Yu Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/984,034

(22) Filed: Dec. 30, 2015

(65) Prior Publication Data

US 2017/0194335 A1    Jul. 6, 2017

(51) Int. Cl.

| | |
|---|---|
| *H01L 29/792* | (2006.01) |
| *H01L 27/1157* | (2017.01) |
| *H01L 27/11573* | (2017.01) |
| *H01L 29/49* | (2006.01) |
| *H01L 29/51* | (2006.01) |

(52) U.S. Cl.
CPC .... *H01L 27/1157* (2013.01); *H01L 27/11573* (2013.01); *H01L 29/4916* (2013.01); *H01L 29/51* (2013.01)

(58) Field of Classification Search
CPC ........... H01L 27/1157; H01L 27/11573; H01L 27/10894
USPC ........................................................ 257/326
See application file for complete search history.

(56) References Cited

U.S. PATENT DOCUMENTS

| | | | |
|---|---|---|---|
| 7,611,941 | B1 | 11/2009 | Shum |
| 8,883,624 | B1 | 11/2014 | Ramkumar |
| 2006/0261398 | A1 | 11/2006 | Lee |
| 2008/0173944 | A1 | 7/2008 | Coronel |
| 2013/0264652 | A1 | 10/2013 | Zhu |
| 2014/0024183 | A1 | 1/2014 | Hsu |
| 2014/0073126 | A1 | 3/2014 | Shen et al. |
| 2014/0374814 | A1 | 12/2014 | Wu et al. |
| 2015/0054049 | A1 | 2/2015 | Perera |

(Continued)

OTHER PUBLICATIONS

Non Final Office Action Dated Oct. 6, 2016 U.S. Appl. No. 14/984,095.

(Continued)

*Primary Examiner* — Long K Tran
(74) *Attorney, Agent, or Firm* — Eschweiler & Potashnik, LLC

(57) ABSTRACT

The present disclosure relates to an integrated circuit (IC) that includes a high-k metal gate (HKMG) non-volatile memory (NVM) device and that provides small scale and high performance, and a method of formation. In some embodiments, the integrated circuit includes a logic region having a logic device disposed over a substrate and including a first metal gate electrode disposed over a first high-k gate dielectric layer and an embedded memory region disposed adjacent to the logic region. The embedded memory region has a non-volatile memory (NVM) device including a second metal gate electrode disposed over the high-k gate dielectric layer. By having HKMG structures in both the logic region and the memory region, IC performance is improved and further scaling becomes possible in emerging technology nodes.

20 Claims, 9 Drawing Sheets

(56) References Cited

U.S. PATENT DOCUMENTS

| | | | |
|---|---|---|---|
| 2015/0093864 A1 | 4/2015 | Perera | |
| 2015/0108475 A1* | 4/2015 | Ando | H01L 27/1255 257/43 |
| 2015/0236034 A1 | 8/2015 | Toh | |
| 2015/0249145 A1 | 9/2015 | Yoshimori | |
| 2015/0279854 A1 | 10/2015 | Hall | |
| 2015/0311221 A1 | 10/2015 | Huang | |
| 2016/0013313 A1* | 1/2016 | Cheng | H01L 29/267 257/408 |
| 2016/0126327 A1 | 5/2016 | Chen | |

OTHER PUBLICATIONS

U.S. Appl. No. 14/984,095, filed Dec. 30, 2015.
U.S. Appl. No. 14/983,682, filed Dec. 30, 2015.
U.S. Appl. No. 14/983,686, filed Dec. 30, 2015.
Non Final Office Action Dated Nov. 3, 2016 U.S. Appl. No. 14/983,682.
Non Final Office Action Dated Nov. 3, 2016 U.S. Appl. No. 14/983,686.
Final Office Action dated Apr. 4, 2017 in connection with U.S. Appl. No. 14/983,686.
Final Office Action received on Apr. 27, 2017 in regards to U.S. Appl. No. 14/984,095.
Notice of Allowance dated Mar. 31, 2017 for U.S. Appl. No. 14/983,682.
Notice of Allowance dated Aug. 1, 2017 in connection with U.S. Appl. No. 14/983,686.
Notice of Allowance dated on Jul. 27, 2017 in connection with U.S. Appl. No. 14/984,095.

* cited by examiner

EMBEDDED HKMG NON-VOLATILE MEMORY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory enables high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
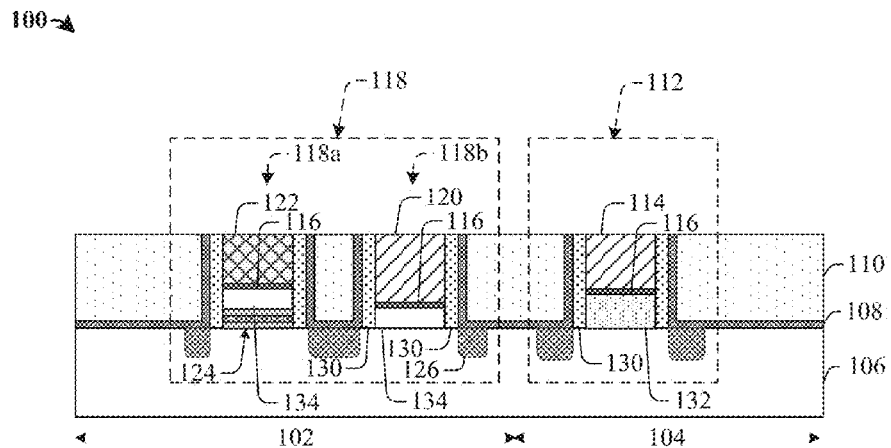
FIG. 1 illustrates a cross-sectional view of some embodiments of an integrated circuit (IC) comprising a high-k metal gate (HKMG) non-volatile memory (NVM) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory, which may include an array of two transistors (2T) memory cells. A 2T memory cell comprises a control transistor and a select transistor laterally spaced over the semiconductor substrate. A control gate of the control transistor is separated from the substrate by a charge trapping dielectric layer.

High-k metal gate (HKMG) technology has also become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power.

The present disclosure relates to an integrated circuit (IC) that comprises a small scale and high performance high-k metal gate (HKMG) non-volatile memory (NVM) device, and a method of formation. In some embodiments, the integrated circuit comprises a logic region and an adjacent embedded memory region disposed over a substrate. The logic region comprises a logic device including a first metal gate electrode disposed over a high-k gate dielectric layer, and the memory region comprises a non-volatile memory (NVM) device including a second metal gate electrode disposed over the high-k gate dielectric layer. In some embodiments, the NVM device comprises a select transistor including a select gate electrode and laterally spaced apart from a control transistor, which includes a control gate electrode separated from the substrate by a charge trapping layer. At least one of the select gate electrode and the control gate electrode is a metal gate electrode. By having HKMG structures in both the logic region and the memory region, IC performance is improved and further scaling becomes possible in emerging technology nodes (e.g., 28 nm and below).

FIG. 1 illustrates a cross-sectional view of some embodiments of an IC 100 comprising a HKMG NVM device (e.g., a HKMG 2T NVM device, or a hybrid 2T NVM device). The IC 100 comprises a logic region 104 and an embedded memory region 102 disposed adjacent to the logic region 104. The logic region 104 comprises a logic device 112 disposed over a substrate 106. The logic device 112 comprises a first metal gate electrode 114 disposed over a high-k gate dielectric layer 116. In some embodiments, the first metal gate electrode 114 may be further separated from the substrate 106 by a logic gate oxide 132. The embedded memory region 102 comprises a non-volatile memory (NVM) device 118 including a second metal gate electrode (e.g., select gate electrode 120 or control gate electrode 122) disposed over the high-k gate dielectric layer 116.

In some embodiments, the NVM device 118 comprises a control transistor 118a and a select transistor 118b. In some embodiments, the second metal gate electrode is a select gate electrode 120 of the select transistor 118b. In such embodiments, select gate electrode 120 is further separated from the substrate 106 by a memory gate oxide 134. In some embodiments, the first and second metal gate electrodes may have cuboid shapes, which have upper surfaces aligned with one another. By having HKMG structure in both the logic device 112 and the NVM device 118, transistor capacitance (and thereby drive current) is increased and gate leakage and threshold voltage are reduced.

In some embodiments, the control transistor 118a comprises a control gate electrode 122 separated from the substrate by the high-k gate dielectric layer 116, the memory gate oxide 134 and a charge trapping layer 124. In some embodiments, the control gate electrode 122 comprises polysilicon. Source/drain regions 126 are arranged at opposite sides of the select gate electrode 120 and the control gate electrode 122. The select gate electrode 120 may be connected to a word line, which is configured to control access of the NVM device 118. The high-k gate dielectric layer 116 reduces tunneling gate leakage, and allows a low voltage to be applied to the select gate electrode 120 to form an inversion channel below the select gate electrode 120. During operation, charges (e.g. electrons) can be injected to/from the charge trapping layer 124 to program/erase the NVM device 118. The low select gate voltage helps to minimize drain current and leads to a relatively small programming power. A high voltage is applied to the control gate electrode 122 which attracts or repels electrons to or from the charge trapping layer 124, yielding a high injection or removal efficiency.

In some embodiments, the IC 100 further comprises a sidewall spacer 130 disposed along sidewalls of the first metal gate electrode 114, the select gate electrode 120 and the control gate electrode 122. In some embodiments, the sidewall spacer 130 can be made of silicon nitride. The sidewall spacers 130 have upper surfaces that are aligned with upper surfaces of the first metal gate electrode 114, the select gate electrode 120 and the control gate electrode 122.

The logic region 104 and the embedded memory region 102 may be laterally separated from one another by an inter-layer dielectric layer 110 arranged over the substrate 106. In some embodiments, a contact etch stop layer 108 separates the inter-layer dielectric layer 110 from the logic device 112, the NVM device 118 and the substrate 106. The contact etch stop layer 108 may line the logic device 112 and the NVM device 118 and have a substantially planar lateral portion that extends between the logic region 104 and the embedded memory region 102. Using the inter-layer dielectric layer 110 and the contact etch stop layer 108 to isolate the logic device 112 and the NVM device 118 allows for high device density to be achieved.

Figure 2:
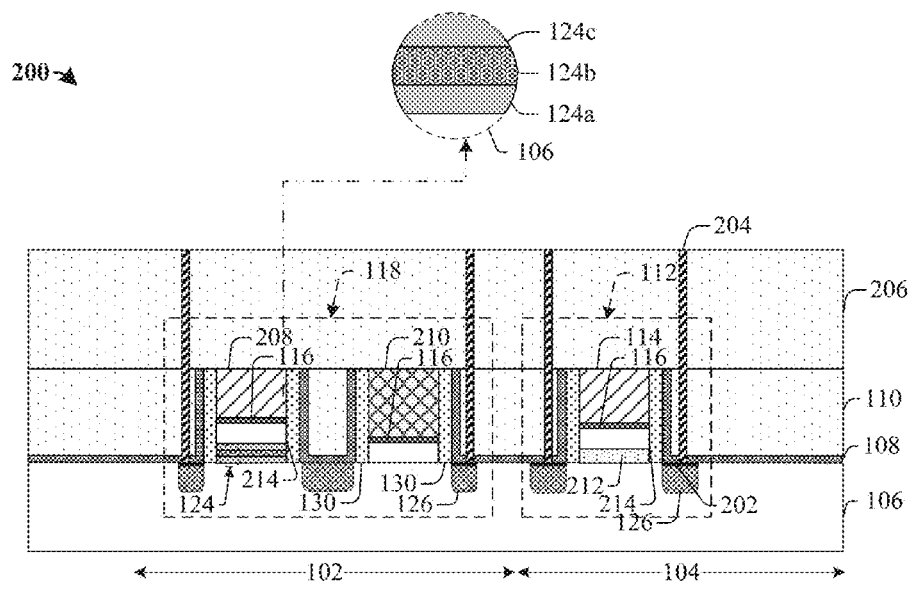
FIG. 2 illustrates a cross-sectional view of some additional embodiments of an IC comprising a HKMG NVM device.

FIG. 2 illustrates a cross-sectional view of some additionall embodiments of an IC 200 comprising a HKMG NVM device, or a hybrid NVM device. The IC 200 comprises a logic region 104 having a logic device 112 and an embedded memory region 102 having a NVM device 118. A plurality of source/drain regions 126 are disposed within a substrate 106 in the logic region 104 and the embedded memory region 102. A silicide layer 202 is arranged onto the source/drain regions 126. In some embodiments, the silicide layer 202 comprises a nickel silicide. A first metal gate electrode 114 is disposed over the substrate 106 within the logic region 104 at a location between source/drain regions 126. The first metal gate electrode 114 is separated from the substrate 106 by a high-k gate dielectric layer 116 and a logic gate oxide 212.

Within the memory region 102, a select gate electrode 210 and a control gate electrode 208 are spaced apart over the substrate 106 on the high-k gate dielectric layer 116 and a memory gate oxide 214. In some embodiments, the logic device 112 may be a high voltage device. In such embodiments, the memory gate oxide 214 may also be disposed below the first metal gate electrode 114 between the high-k gate dielectric layer 116 and the logic gate oxide 212, collectively forming a gate dielectric for the logic device 112 with a greater thickness than that of the NVM device 118. In some alternative embodiments not shown by FIG. 2, the logic device 112 may be a logic gate transistor that has an operation voltage smaller than that of the NVM device 118, such that lower power consumption can be achieved. In such embodiments, the gate dielectric of the logic device 112 may have a thickness smaller than that of the memory gate oxide 214. Furthermore, the gate dielectric for the logic device 112 may also have the same thickness of the memory gate oxide 214 for simplifying manufacturing complexity. A charge trapping layer 124 is disposed between the control gate electrode 208 and the substrate 106.

In some embodiments, the charge trapping layer 124 may comprise a tri-layer structure. For example, in some embodiments, the tri-layer structure may comprise an ONO structure having a first dielectric layer 124a (e.g. a silicon dioxide layer), a nitride layer 124b (e.g. a silicon nitride layer) contacting the first dielectric layer 124a, and a second dielectric layer 124c (e.g. a silicon dioxide layer) contacting the nitride layer 124b. In other embodiments, the tri-layer structure may comprise an oxide-nano-crystal-oxide (ONCO) structure having a first oxide layer, a layer of crystal nano-dots (e.g. silicon dots) contacting the first oxide layer, and a second oxide layer contacting the first oxide layer and the layer of crystal nano-dots. In some embodiments, the control gate electrode 208 is a metal gate, and the select gate electrode 210 comprises polysilicon. In some embodiments, the first metal gate electrode 114 and the control gate electrode 208 may comprise titanium (Ti), tantalum (Ta), tungsten (W), aluminum (Al) or zirconium (Zr), for example. In some embodiments, the high-k gate dielectric layer 116 may comprise hafnium oxide (HfO), hafnium silicon oxide (HfSiO), hafnium aluminum oxide (HfAlO), or hafnium tantalum oxide (HfTaO), for example.

In some embodiments, a contact etch stop layer 108 lines sidewalls of a sidewall spacer 130 and continuously extends along an upper surface of the substrate 106 and the silicide layer 202. In some embodiments, the contact etch stop layer 108 has a 'U' shaped structure with a lateral component connecting a first vertical component abutting the sidewall spacer 130 arranged along a side of the NVM device 118 and a second vertical component abutting the sidewall spacer 130 arranged along a side of the logic device 112. In some embodiments, the contact etch stop layer 108 also has a 'U' shaped structure between the select transistor 118b and the control transistor 118a.

A first inter-layer dielectric layer 110 is disposed within recesses of the contact etch stop layer 108. In some embodiments, the first inter-layer dielectric layer 110 has an upper surface aligned with upper surfaces of the select gate electrode 210, the control gate electrode 208, and the first metal gate electrode 114. In some embodiments, a second inter-layer dielectric layer 206 can be disposed over the NVM device 118 and the logic device 112. In some embodiments, the first inter-layer dielectric layer 110 and the second inter-layer dielectric layer 206 may comprise a low-k dielectric layer, an ultra low-k dielectric layer, an extreme low-k dielectric layer, and/or a silicon dioxide layer. A plurality of contacts 204 comprising a conductive material extend vertically through the second inter-layer dielectric layer 206. In some embodiments, one or more of the plurality of contacts may also extend through the first inter-layer dielectric layer 110 and the contact etch stop layer 108 and be coupled to the source/drain regions 126. In some embodiments, the plurality of contacts 204 may comprise a metal such as tungsten, copper, and/or aluminum.

Figure 3:
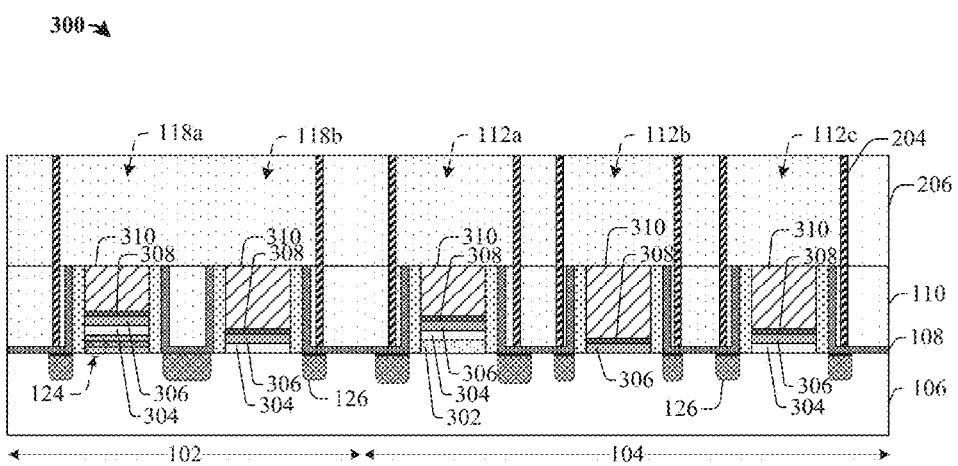
FIG. 3 illustrates a cross-sectional view of some additional embodiments of an IC comprising a HKMG NVM device.

FIG. 3 illustrates a cross-sectional view of some additional embodiments of an IC 300 comprising a HKMG NVM device. The IC 300 comprises a logic region 104 and an adjacent memory region 102 arranged over a substrate 106. The logic region 104 may comprise one or more pluralities of logic devices, such as a high voltage device 112a (e.g. CMOS transistors for memory programing/erasing), a core device 112b (e.g. CMOS logic gates for processing memory data), and an I/O (input/output) device 112c configured to receive and transmit signals. The high voltage device 112a may be operated at a bias voltage higher than an operation voltage of the core device 112b, thereby having higher operation power and higher breakdown voltage than the core device 112b. Furthermore, the I/O device 112c may also be operated at a bias voltage higher than the bias voltage of the core device 112b, thereby making the I/O device 112c capable of heavy current driving. Because of the different operating voltages the devices may have gate electrodes overlying different gate oxide thicknesses (e.g., the high voltage device 112a has one or more underlying oxide(s) with a collective greater thickness than the core device 112b and the I/O device 112c).

For example, in some embodiments, the gate oxide of the high voltage device 112a comprises a first gate oxide layer 302, a second oxide layer 304 and a third oxide layer 306 stacked in that order. A gate oxide of the core device 112b may comprise the third oxide layer while the first and second gate oxide layers 302, 304 are absent, thus forming a thinner gate oxide. A gate oxide of the I/O device 112c may comprise the second and third gate oxide layers 304, 306 while the first oxide layer 302 is absent. In some embodiments, the memory region 102 comprises a control transistor 118a and a select transistor 118b, which may have the same gate oxide with the I/O device 112c (i.e., the second and third gate oxide layers 304, 306). The logic devices 112a-112c, the control transistor 118a and the select transistor 118b may also respectively comprises metal gate electrodes 310 and high-k gate dielectric layers 308 disposed on corresponding gate oxides. The control transistor 118a further comprises a charge trapping layer 124 disposed under its gate oxide.

Though not shown in above figures, logic devices (e.g. 112a, 112b, 112c) of the logic region 104 and memory devices (e.g. 118a, 118b) of the memory region 102 may comprise metal gates with different compositions and thicknesses. For example, the logic region 104 may comprise an NMOS transistor device having an NMOS metal gate and a PMOS transistor device having a PMOS metal gate. The NMOS metal gate has a different composition and a different work function than the PMOS metal gate. In some embodiments, the metal gates may have upper surfaces aligned one from another.

FIGS. 4-14C illustrate a series of cross-sectional views 400-1400c of some embodiments of a method for manufacturing an IC comprising a HKMG NVM device.

Figure 4:
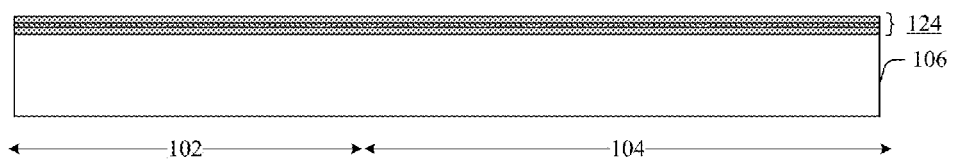
FIGS. 4-14C illustrate a series of cross-sectional views of some embodiments of a method for manufacturing an IC comprising a HKMG NVM device.

As shown in cross-sectional view 400 of FIG. 4, a charge trapping layer 124 is formed over a substrate 106. The substrate 106 may comprise a logic region 104 and a memory region 102. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. In some embodiments, the charge trapping layer 124 is formed by using a deposition technique (e.g., PVD, CVD, PE-CVD, ALD, etc.) to form a tri-layer structure comprising an ONO structure having a first oxide layer (e.g. a silicon dioxide layer), a nitride layer (e.g. a silicon nitride layer) contacting the first oxide layer, and a second oxide layer contacting the nitride layer.

Figure 5:
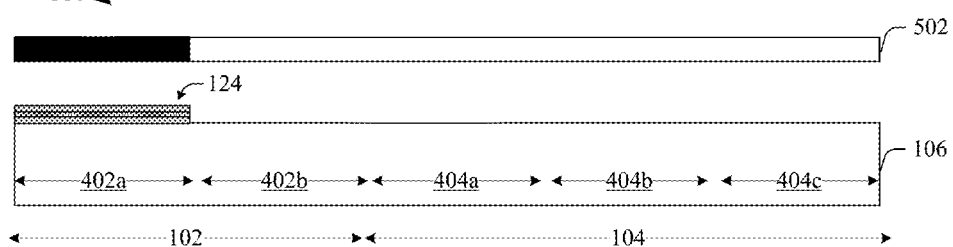

As shown in cross-sectional view 500 of FIG. 5, the charge trapping layer 124 is patterned so that it remains within a control transistor region 402a of the memory region 102 and so that it is removed from remaining areas of the memory region 102 and the logic region 104. In some embodiments, the charge trapping layer 124 is removed by performing a photolithography process (e.g., using a mask 502) that patterns a photosensitive masking layer (e.g., photoresist) that protects the charge trapping layer 124 at the control transistor region 402a from removal by one or more subsequent etching processes. In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.).

Figure 6:
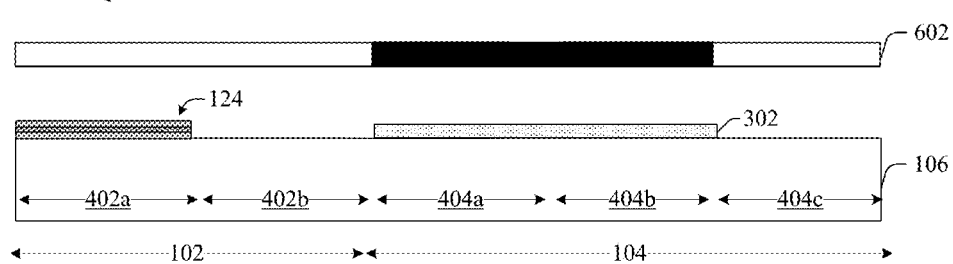

As shown in cross-sectional view 600 of FIG. 6, a first oxide layer 302 is formed and patterned so that it remains within a high voltage device region 404a and a core device region 404b of the logic region 104 and so that it is removed from remaining areas of the logic region 104 and the memory region 102. In some embodiments, the first oxide layer 302 is formed by using a deposition technique (e.g., PVD, CVD, PE-CVD, ALD, etc.) and removed by performing a photolithography process (e.g., using a mask 602) and an etching process.

Figure 7:
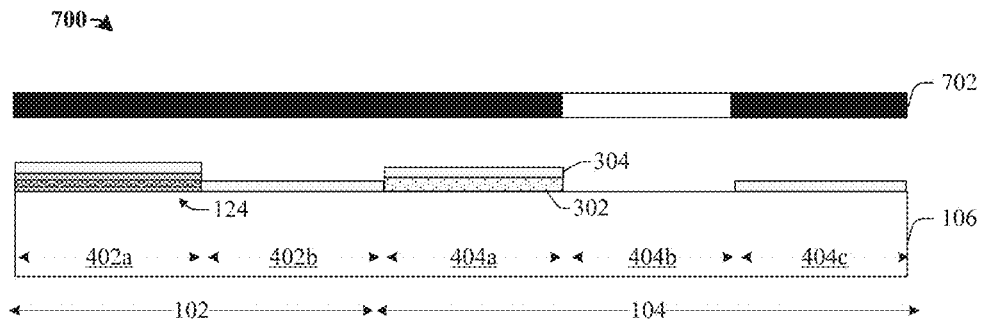

As shown in cross-sectional view 700 of FIG. 7, a second oxide layer 304 is formed and patterned so that it is removed from a core device region 404b of the logic region 104 so that it remains within remaining areas of the logic region 104 and the memory region 102. In some embodiments, the second oxide layer 304 is formed by using a deposition technique (e.g., PVD, CVD, PE-CVD, ALD, etc.) and removed by performing a photolithography process (e.g., using a mask 702) and an etching process. In some embodiments, an excessive portion of the first oxide layer 302 at the core device region 404b can be patterned and removed together with the patterning of the second oxide layer 304.

Figure 8:
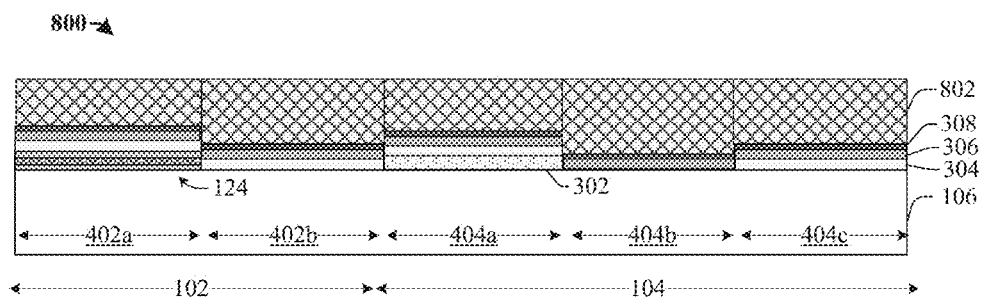

As shown in cross-sectional view 800 of FIG. 8, a third oxide layer 306, a high-k gate dielectric layer 308 and a sacrificial gate layer 802 are subsequently formed. A planarization process can be performed on the sacrificial gate layer 802.

Figure 9:
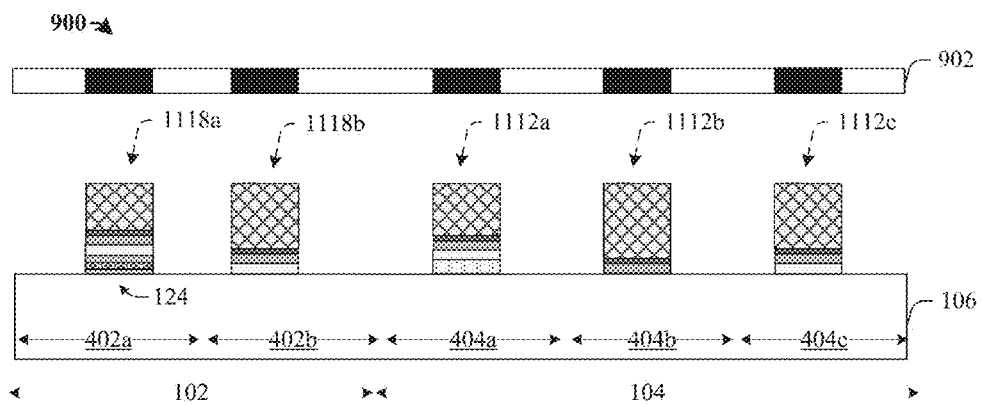

As shown in cross-sectional view 900 of FIG. 9, the sacrificial gate layer 802, the high-k gate dielectric layer 308 and the oxide layers 306, 304, 302 are patterned to form a control gate stack 1118a and a select gate stack 1118b at the memory region 102 and a high voltage gate stack 1112a, a core gate stack 1112b and an I/O gate stack 1112c at the logic region 104. In some embodiments, a sacrificial oxide or nitride hard mask layer (not shown) is formed over the gate stacks. In some embodiments, sacrificial gate layer 802 may comprise polysilicon or metal formed by a deposition process (e.g., CVD, PVD, ALD, etc.). In some embodiments, the gate stacks are formed by performing a photolithography process (e.g., using a mask 902) that patterns a photosensitive masking layer (e.g., photoresist), which protects masked areas from removal by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.).

Figure 10:
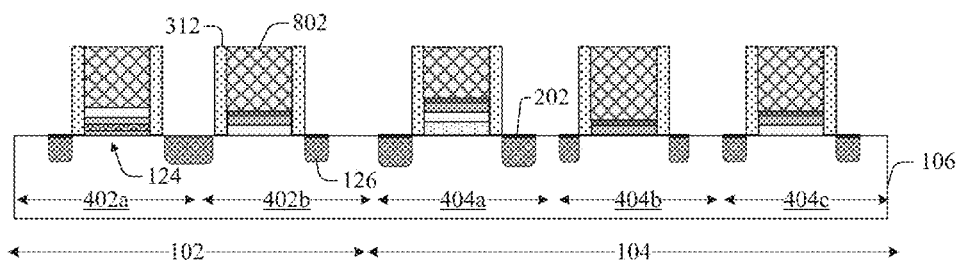

As shown in cross-sectional view 1000 of FIG. 10, a sidewall spacer 312 is formed along the gate stacks 1118a-b, 1112a-c. In some embodiments, the sidewall spacer 312 may comprise an oxide (e.g., $SiO_2$) or a nitride (e.g., SiN) formed by a deposition process. The sidewall spacer 312 may be formed directly on an upper surface of the substrate 106. Source/drain regions 126 are subsequently formed within the memory region 102 and within the logic region 104, respectively. In some embodiments, the source/drain regions 126 may be formed by an implantation process that selectively implants the substrate 106 with a dopant, such as boron (B) or phosphorous (P), for example. In some other embodiments, the source/drain regions 126 may be formed by performing an etch process to form a trench followed by an epitaxial growth process. In such embodiments, the source/drain regions 126 may have a raised portion that is higher than the upper surface of the substrate 106. In some embodiments, a salicidation process is performed to form a silicide layer 202 on upper surfaces of the source/drain regions 126. In some embodiments, the salicidation process may be performed by depositing a nickel layer and then performing a thermal annealing process (e.g., a rapid thermal anneal).

Figure 11:
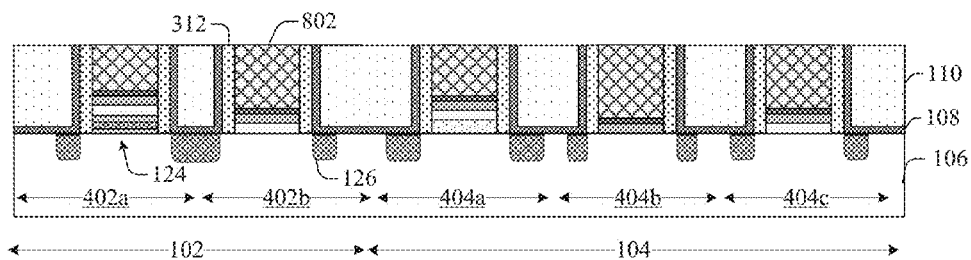

As shown in cross-sectional view 1100 of FIG. 11, a conformal contact etch stop layer 108 is formed over the source/drain regions 126 and extends along the sidewall spacer 312. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first planarization process may comprise a chemical mechanical polishing (CMP) process. In some embodiments, the first inter-layer dielectric layer 110 may comprise a low-k dielectric layer, formed by way of a deposition process (e.g., CVD, PVD, etc.). The sacrificial gate layer 802 is exposed after the first planarization process. FIGS. 12A-12C, 13A-13C and 14A-14C show some alternative embodiments of a subsequent replacement gate process following FIG. 11.

Figure 12A:
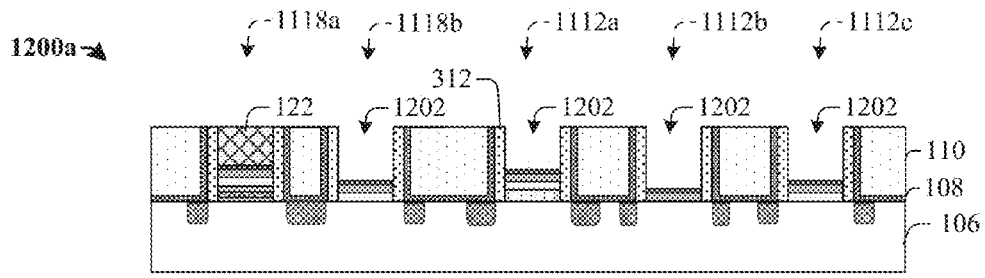
Figure 12B:
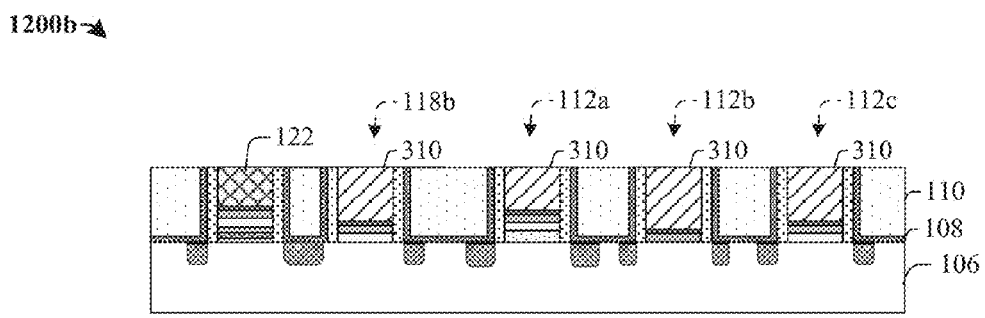
Figure 12C:
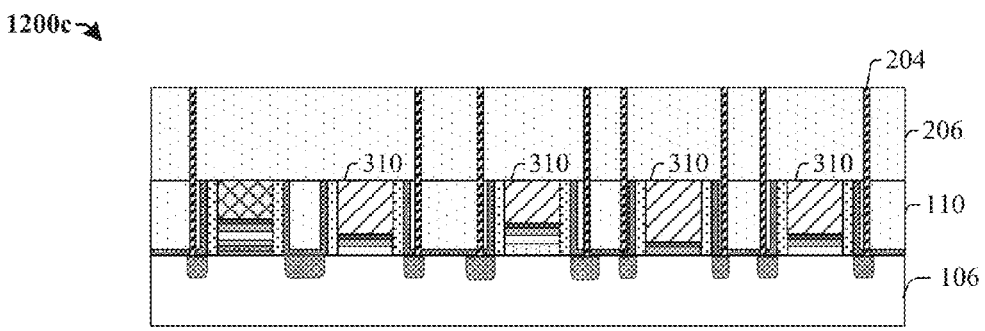

FIGS. 12A-12C show some embodiments of the replacement gate process. As shown in cross-sectional view 1200a of FIG. 12A, the sacrificial gate layer 802 (shown in FIG. 11) is removed from the select gate stack 1118b, the high voltage gate stack 1112a, the core gate stack 1112b and the I/O gate stack 1112c, resulting in the formation of trenches 1202 between the sidewall spacers 312. The sacrificial gate layer 802 (shown in FIG. 11) may remain in the control gate stack 1118a, leaving a control gate electrode 122 in place.

As shown in cross-sectional view 1200b of FIG. 12B, metal gate electrodes are filled into the trenches 1202 of FIG. 12A through one or more deposition processes (e.g., chemical vapor deposition, physical vapor deposition, etc.). Though shown as depositing a single metal layer, it is appreciated that the replacement gate process may comprise a series of deposition and etching processes that form different metal compositions within trenches for different logic/memory devices, or different components of the same logic/memory devices. In this way, desired work functions can be achieved. A second planarization process may be performed following the deposition processes to form a select transistor 118b within the memory region 102 and a high voltage device 112a, a core device 112b and an I/O device 112c within the logic region 104, which have metal gate electrodes 310.

As shown in cross-sectional view 1200c of FIG. 12C, contacts 204 are formed within a second inter-layer dielectric layer 206 overlying the first inter-layer dielectric layer 110. The contacts 204 may be formed by selectively etching the second inter-layer dielectric layer 206 to form openings, and by subsequently depositing a conductive material within the openings. In some embodiments, the conductive material may comprise tungsten (W) or titanium nitride (TiN), for example.

Figure 13A:
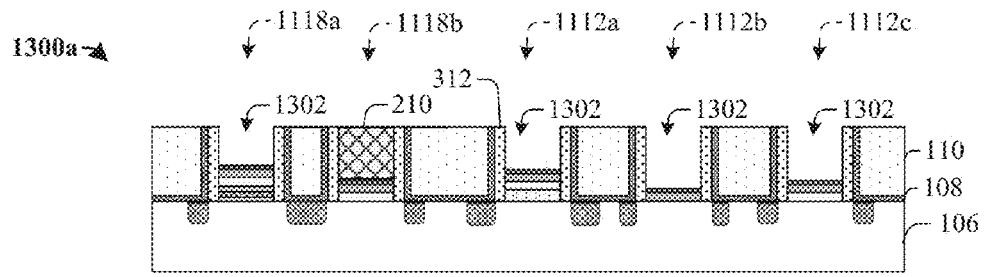
Figure 13B:
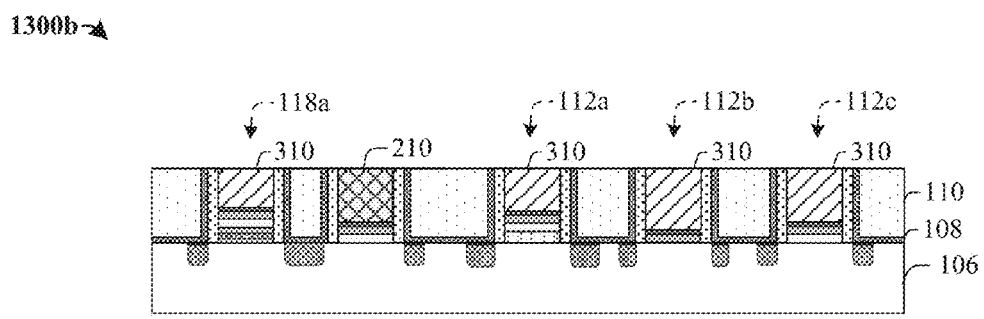
Figure 13C:
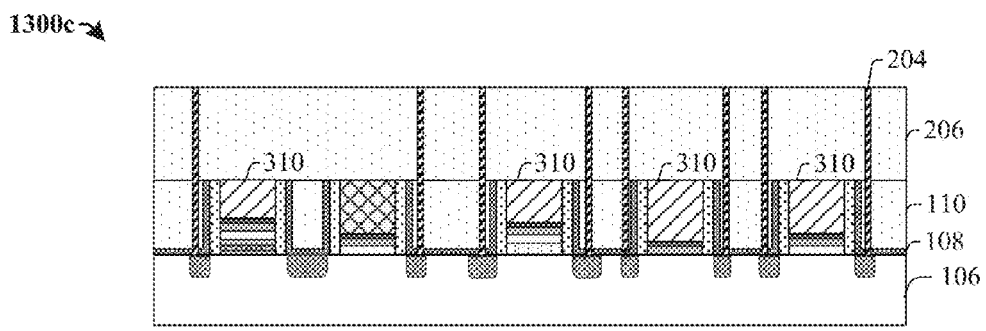

FIGS. 13A-13C show some alternative embodiments of the replacement gate process. As shown in cross-sectional view 1300a of FIG. 13A, the sacrificial gate layer 802 (shown in FIG. 11) is removed from the control gate stack 1118a, the high voltage gate stack 1112a, the core gate stack 1112b and the I/O gate stack 1112c, resulting in the formation of trenches 1302 between the sidewall spacers 312. The sacrificial gate layer 802 (shown in FIG. 11) may remain within the select gate stack 1118b, leaving a select gate electrode 210 in place.

As shown in cross-sectional view 1300b of FIG. 13B, metal gate electrodes are filled into the trenches 1302 of FIG. 13A through one or more deposition processes. A second planarization process may be performed following the deposition processes to form a control transistor 118a within the memory region 102 and a high voltage device 112a, a core device 112b and an I/O device 112c within the logic region 104, which have metal gate electrodes 310.

As shown in cross-sectional view 1300c of FIG. 13C, contacts 204 are formed within a second inter-layer dielectric layer 206 overlying the first inter-layer dielectric layer 110. The contacts 204 may be formed by selectively etching the second inter-layer dielectric layer 206 to form openings, and by subsequently depositing a conductive material within the openings. In some embodiments, the conductive material may comprise tungsten (W) or titanium nitride (TiN), for example.

Figure 14A:
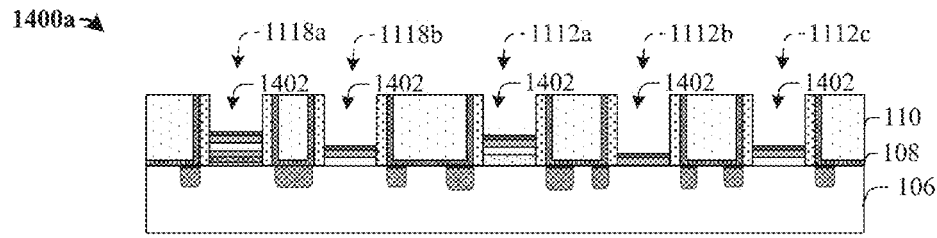
Figure 14B:
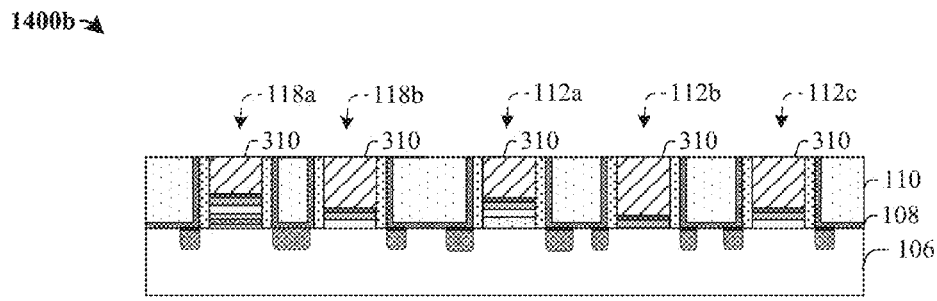
Figure 14C:
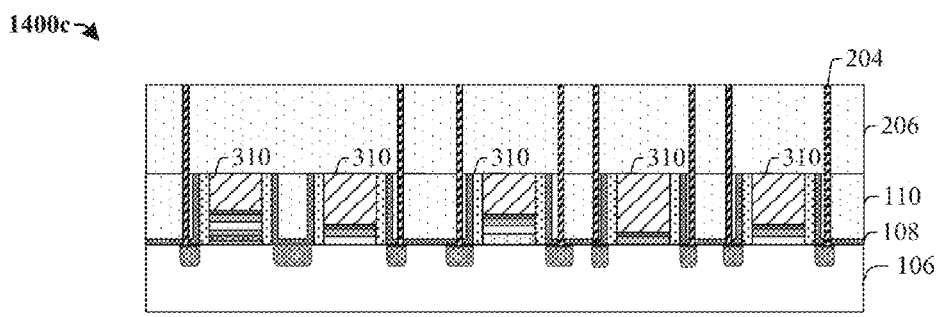

FIGS. 14A-14C show some alternative embodiments of the replacement gate process. As shown in cross-sectional view 1400a of FIG. 14A, the sacrificial gate layer 802 (shown in FIG. 11) is removed from the control gate stack 1118a, the select gate stack 1118b, the high voltage gate stack 1112a, the core gate stack 1112b and the I/O gate stack 1112c, resulting in the formation of trenches 1402 between the sidewall spacers 312. The sacrificial gate layer 802 (shown in FIG. 11) may be removed by a wet etching process without using a mask.

As shown in cross-sectional view 1400b of FIG. 14B, metal gate electrodes are filled into the trenches 1402 of FIG. 14A through one or more deposition processes. A second planarization process may be performed following the deposition processes to form a control transistor 118a, a select transistor 118b, a high voltage device 112a, a core device 112b and an I/O device 112c, which have metal gate electrodes 310.

As shown in cross-sectional view 1400c of FIG. 14C, contacts 204 are formed within a second inter-layer dielectric layer 206 overlying the first inter-layer dielectric layer 110. The contacts 204 may be formed by selectively etching the second inter-layer dielectric layer 206 to form openings, and by subsequently depositing a conductive material within the openings. In some embodiments, the conductive material may comprise tungsten (W) or titanium nitride (TiN), for example.

Figure 15:
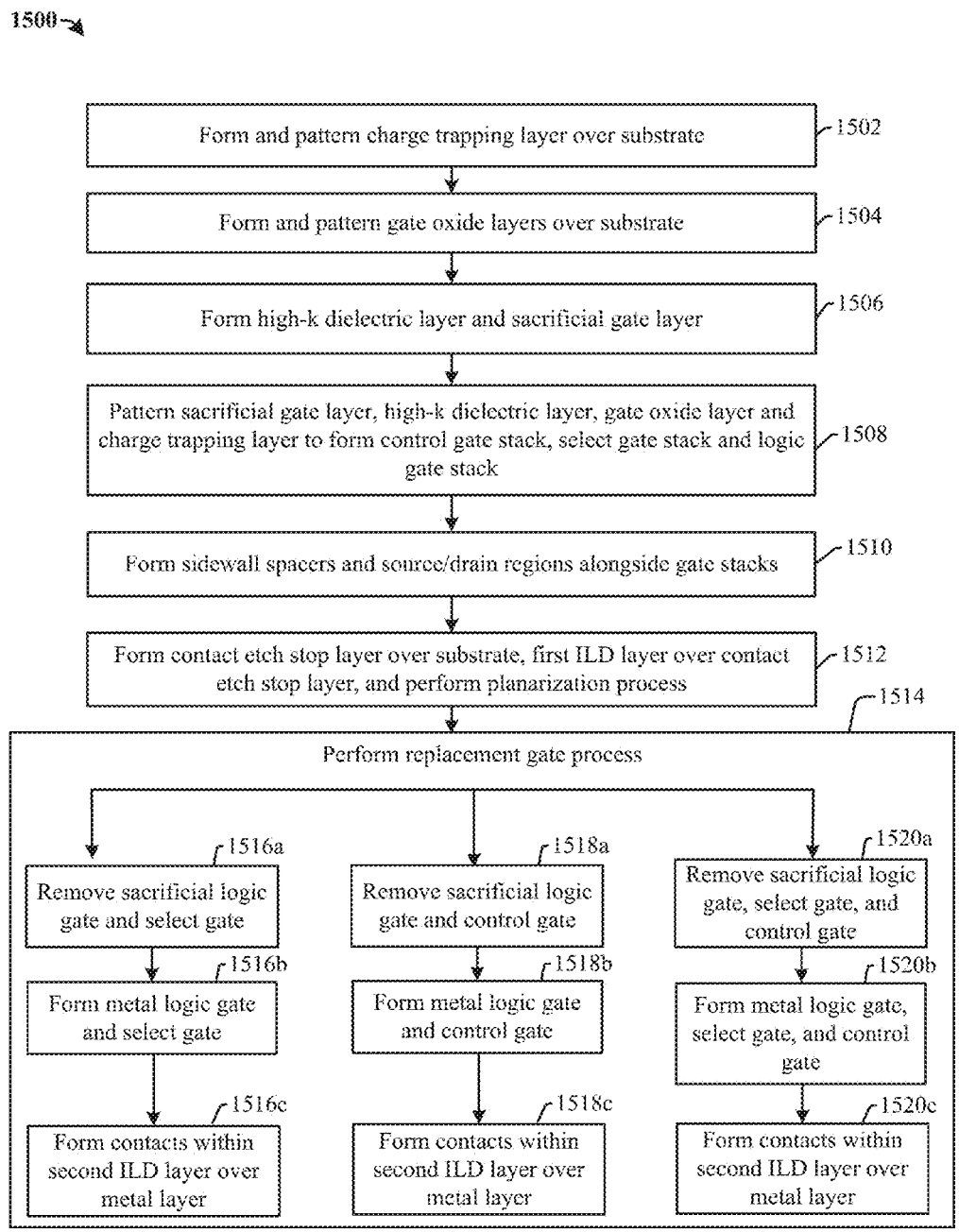
FIG. 15 illustrates a flow diagram of some embodiments of a method for manufacturing an IC comprising a HKMG NVM device.

FIG. 15 illustrates a flow diagram of some embodiments of a method 1500 for manufacturing an IC comprising a HKMG NVM device.

Although method 1500 is described in relation to FIGS. 4-14C, it will be appreciated that the method 1500 is not limited to such structures, but instead may stand alone as a method independent of the structures. Furthermore, while the disclosed methods (e.g., method 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a charge trapping layer is formed and patterned at a control transistor region of a memory region over a substrate. FIGS. 4-5 illustrate some embodiments of cross-sectional views 400 and 500 corresponding to act 1502.

At 1504, gate oxide layers are formed and patterned over the substrate. In some embodiments, gate oxide for the memory region is formed of different thicknesses from a high voltage device region and/or a core device region of a logic region. FIGS. 6-7 illustrate some embodiments of cross-sectional views 600 and 700 corresponding to act 1504.

At 1506, a high-k gate dielectric layer and a sacrificial gate layer are formed subsequently over the gate oxide layers. The sacrificial gate layer may comprise metal or polysilicon. A planarization process can be performed on the sacrificial gate layer. FIG. 8 illustrates some embodiments of a cross-sectional view 800 corresponding to act 1506.

At 1508, the sacrificial gate layer, the high-k gate dielectric layer and the oxide layers are patterned to form a control gate stack and a select gate stack at the memory region and a high voltage gate stack, a core gate stack and an I/O gate stack at the logic region. FIG. 9 illustrates some embodiments of a cross-sectional view 900 corresponding to act 1508.

At 1510, a sidewall spacer is formed along sidewall of the gate stacks. The source/drain regions are formed within the substrate. FIG. 10 illustrates some embodiments of a cross-sectional view 1000 corresponding to act 1510.

At 1512, a contact etch stop layer is formed over the substrate, a first inter-level dielectric layer is formed over the contact etch stop layer, and a first planarization is performed. The sacrificial gates within the logic region and the memory region are exposed. FIG. 11 illustrates some embodiments of a cross-sectional view 1100 corresponding to act 1512.

At 1514, a replacement gate process is subsequently performed. In various embodiments, the replacement gate process may be formed according to acts 1516a-1516c, acts 1518a-1518c, or acts 1520a-1520c.

At 1516a-1516c, a logic gate electrode within the logic region and a select gate electrode within the memory region are replaced by a metal gate electrode. FIGS. 12A-12C illustrate some embodiments of cross-sectional views 1200a-1200c corresponding to act 1516a-1516c.

At 1518a-1518c, a logic gate electrode within the logic region and a control gate electrode within the memory region are replaced by a metal gate electrode. FIGS. 13A-13C illustrate some embodiments of cross-sectional views 1300a-1300c corresponding to act 1518a-1518c.

At 1520a-1520c, a logic gate within the logic region and a select gate electrode and a control gate electrode within the memory region are replaced by a metal gate electrode. FIGS. 14A-14C illustrate some embodiments of cross-sectional views 1400a-1400c corresponding to act 1520a-1520c.

Therefore, the present disclosure relates to an integrated circuit (IC) that comprises a high-k metal gate (HKMG) non-volatile memory (NVM) device and that provides small scale and high performance, and a method of formation.

In some embodiments, the present disclosure relates to an integrated circuit. The integrated circuit comprises a logic region and an embedded memory region disposed adjacent to the logic region. The logic region comprises a logic device disposed over a substrate and including a first metal gate electrode disposed over a first high-k gate dielectric layer. The embedded memory region comprises a non-volatile memory (NVM) device including a second metal gate electrode disposed over the high-k gate dielectric layer. The NVM device comprises a select transistor and a control transistor laterally spaced apart on the substrate. The control transistor comprises a control gate electrode separated from the substrate by a charge trapping layer and the high-k gate dielectric layer.

In other embodiments, the present disclosure relates to an integrated circuit. The integrated circuit comprises a logic region and an embedded memory region disposed adjacent to the logic region. The logic region comprises a logic device disposed over a substrate and including a first metal gate electrode disposed over a first high-k gate dielectric layer. The embedded memory region comprises a non-volatile memory (NVM) device including a select transistor and a control transistor laterally spaced apart on the substrate. The select transistor or the control transistor comprises a second metal gate electrode separated from the substrate by the high-k gate dielectric layer and a memory gate oxide.

In yet other embodiments, the present disclosure relates to a method of forming an integrated circuit. The method comprises providing a substrate comprising a logic region having a logic device and a memory region having a NVM device including a select transistor and a control transistor spaced apart one from another. The method further comprises forming gate oxide layers, a high-k gate dielectric layer and a polysilicon layer over the substrate and patterning the polysilicon layer, the high-k gate dielectric layer and the gate oxide layers to form a logic sacrificial gate stack within the logic region and a select sacrificial gate stack and a control sacrificial gate stack within the memory region. The method further comprises replacing the logic sacrificial gate stack and at least one of the select sacrificial gate stack and the control sacrificial gate stack with a metal layer to form a first metal gate electrode within the logic region and a second metal gate electrode within the memory region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a logic region comprising a logic device disposed over a substrate and including a first metal gate electrode disposed over a high-k gate dielectric layer, a logic gate oxide layer and a memory gate oxide layer; and
an embedded memory region disposed adjacent to the logic region and comprising a non-volatile memory (NVM) device including a second metal gate electrode disposed over the high-k gate dielectric layer;
wherein the NVM device comprises a select transistor and a control transistor laterally spaced apart on the substrate, wherein the control transistor comprises a control gate electrode separated from the substrate by a charge trapping layer and the high-k gate dielectric layer, and the select transistor comprises a select gate electrode separated from the substrate by the high-k gate dielectric layer and the memory gate oxide layer;
wherein the memory gate oxide layer is arranged between the high-k gate dielectric layer and the logic gate oxide layer below the first metal gate electrode.

2. The IC of claim 1, wherein the second metal gate electrode comprises the select gate electrode of the select transistor.

3. The IC of claim 2, wherein the control gate electrode comprises polysilicon and is separated from the charge trapping layer by the high-k gate dielectric layer and the memory gate oxide layer.

4. The IC of claim 2, wherein the control gate electrode is a metal gate electrode and is separated from the charge trapping layer by the high-k gate dielectric layer and the memory gate oxide layer.

5. The IC of claim 2, wherein the logic gate oxide layer has a thickness that is greater than a thickness of the memory gate oxide layer.

6. The IC of claim 1, wherein the charge trapping layer comprises a charge trapping element arranged between two dielectric layers.

7. The IC of claim 2, further comprising:
a sidewall spacer disposed to cover sidewalls of the first metal gate electrode and the logic gate oxide layer, the control gate electrode, the charge trapping layer, the select gate electrode, and the memory gate oxide layer.

8. The IC of claim 7, further comprising:
source/drain regions disposed within the substrate alongside the first metal gate electrode, the select gate electrode and the control gate electrode;
a silicide layer disposed on the source/drain regions;
a contact etch stop layer disposed along sidewalls of the sidewall spacer, extending continuously on an upper surface of the substrate and the silicide layer; and
an inter-layer dielectric layer disposed on the contact etch stop layer.

9. The IC of claim 8, wherein the contact etch stop layer has a U shaped structure between the logic region and the embedded memory region, wherein the U shaped structure has a first vertical component abutting the sidewall spacer arranged along a side of the NVM device and a second vertical component abutting the sidewall spacer arranged along an opposing side of the logic device.

10. The IC of claim 1, wherein the control gate electrode is a metal gate electrode and a select gate electrode of the select transistor comprises polysilicon.

11. The IC of claim 1, wherein the charge trapping layer comprises a silicon nitride layer arranged between two silicon dioxide layers.

12. The IC of claim 1, wherein the memory gate oxide is disposed directly on the substrate under the select gate electrode within the memory region.

13. The IC of claim 1, wherein the logic gate oxide is disposed directly on the substrate under the first metal gate electrode within the logic region.

14. An integrated circuit (IC), comprising:
a logic region comprising a logic device disposed over a substrate and including a first metal gate electrode disposed over a high-k gate dielectric layer; and
an embedded memory region disposed adjacent to the logic region and comprising a non-volatile memory (NVM) device including a select transistor and a control transistor laterally spaced apart on the substrate;
a sidewall spacer disposed along sidewalls of the first metal gate electrode, a control gate electrode of the control transistor, and a select gate electrode of the select transistor, wherein a contact etch stop layer is disposed between the logic region and the embedded memory region with a U shaped structure, wherein the U shaped structure abuts the sidewall spacer;
wherein the select transistor or the control transistor comprises a second metal gate electrode separated from the substrate by the high-k gate dielectric layer and a memory gate oxide layer.

15. The IC of claim 14, wherein the control gate electrode of the control transistor and the select gate electrode of the select transistor have a cuboid shape, which have upper surfaces aligned with one another.

16. The IC of claim 15, wherein the first metal gate electrode has an upper surface aligned with the upper surfaces of the control gate electrode and the select gate electrode.

17. An integrated circuit (IC), comprising:
a logic region comprising a logic device disposed over a substrate and including a first metal gate electrode disposed over a high-k gate dielectric layer and a logic gate oxide layer; and
a memory region disposed adjacent to the logic region and comprising a non-volatile memory (NVM) device including a second metal gate electrode disposed over the high-k gate dielectric layer and a memory gate oxide layer;
wherein the NVM device comprises a select transistor and a control transistor laterally spaced apart on the substrate, wherein the control transistor comprises a control gate electrode separated from the substrate by a charge trapping layer, the high-k gate dielectric layer and the memory gate oxide layer, and wherein the select transistor comprises a select gate electrode separated from the substrate by the high-k gate dielectric layer and the memory gate oxide layer;
wherein the logic gate oxide layer comprises a second oxide layer disposed over a first oxide layer, and wherein the memory gate oxide layer comprises the second oxide layer disposed directly on the substrate.

18. The IC of claim 17, wherein the high-k gate dielectric layer covers bottom surfaces of the control gate electrode and the select gate electrode, and have sidewall surfaces aligned with the memory gate oxide layer.

19. The IC of claim 17, wherein the control gate electrode comprises polysilicon and disposed directly on the high-k gate dielectric layer.

20. The IC of claim 17, wherein the logic gate oxide layer has a thickness that is greater than a thickness of the memory gate oxide layer.

* * * * *